*US010677588B2*

(12) United States Patent
Hill et al.

(10) Patent No.: US 10,677,588 B2
(45) Date of Patent: Jun. 9, 2020

(54) LOCALIZED TELECENTRICITY AND FOCUS OPTIMIZATION FOR OVERLAY METROLOGY

(71) Applicant: KLA-Tencor Corporation, Milpitas, CA (US)

(72) Inventors: Andrew V. Hill, Berkley, CA (US); Ohad Bachar, Timrat (IL); Avi Abramov, Haifa (IL); Yuri Paskover, Caesarea (IL); Dor Perry, Haifa (IL)

(73) Assignee: KLA-Tencor Corporation, Milpitas, CA (US)

( * ) Notice: Subject to any disclaimer, the term of this patent is extended or adjusted under 35 U.S.C. 154(b) by 117 days.

(21) Appl. No.: 15/948,941

(22) Filed: Apr. 9, 2018

(65) Prior Publication Data

US 2019/0310080 A1    Oct. 10, 2019

(51) Int. Cl.
| | | |
|---|---|---|
| *G01B 11/27* | (2006.01) | |
| *G06T 7/73* | (2017.01) | |
| *H04N 5/232* | (2006.01) | |
| *G06T 7/33* | (2017.01) | |

(52) U.S. Cl.
CPC .............. *G01B 11/272* (2013.01); *G06T 7/33* (2017.01); *G06T 7/74* (2017.01); *H04N 5/23296* (2013.01)

(58) Field of Classification Search
CPC ................................ G01B 11/272; G06T 7/74
See application file for complete search history.

(56) References Cited

U.S. PATENT DOCUMENTS

| | | | | |
|---|---|---|---|---|
| 6,710,847 | B1* | 3/2004 | Irie ..................... | G03F 7/70475 |
| | | | | 235/462.05 |
| 7,929,857 | B2* | 4/2011 | Baldwin ................ | G01N 21/47 |
| | | | | 396/432 |
| 8,248,591 | B2* | 8/2012 | Bloch .................... | G02B 13/22 |
| | | | | 356/237.1 |
| 9,575,008 | B2* | 2/2017 | Jiang .................. | G01N 21/8806 |
| 2003/0043375 | A1* | 3/2003 | Opsal ................. | G01B 11/0641 |
| | | | | 356/369 |
| 2003/0223630 | A1 | 12/2003 | Adel et al. | |
| 2004/0032581 | A1* | 2/2004 | Nikoonahad .......... | G01N 21/55 |
| | | | | 356/237.2 |

(Continued)

OTHER PUBLICATIONS

International Search Report dated Jul. 19, 2019 for PCT/US2019/025917.

*Primary Examiner* — Irfan Habib
(74) *Attorney, Agent, or Firm* — Suiter Swantz pc llo

(57) ABSTRACT

An overlay metrology tool providing site-by-site alignment includes a controller coupled to a telecentric imaging system. The controller may receive two or more alignment images of an overlay target on a sample captured at two or more focal positions by the imaging system, generate alignment data indicative of an alignment of the overlay target within the imaging system based on the alignment images, set the alignment images as measurement images when the alignment of the overlay target is within selected alignment tolerances, direct the imaging system to adjust the alignment of the overlay target in the imaging system and further receive one or more measurement images from the imaging system when the alignment of the overlay target is outside the selected alignment tolerances, and determine overlay between two or more layers of the sample based on at least one of the measurement images.

44 Claims, 12 Drawing Sheets

(56) References Cited

U.S. PATENT DOCUMENTS

| | | | |
|---|---|---|---|
| 2006/0132807 A1* | 6/2006 | Abdulhalim | G03F 7/70633 356/625 |
| 2007/0009257 A1* | 1/2007 | Baldwin | G01N 21/47 396/439 |
| 2007/0206168 A1 | 9/2007 | Smith et al. | |
| 2008/0055609 A1* | 3/2008 | Finarov | G01B 11/24 356/625 |
| 2008/0174771 A1* | 7/2008 | Yan | G01N 21/8901 356/237.5 |
| 2008/0286885 A1* | 11/2008 | Izikson | G05B 21/02 438/7 |
| 2008/0316442 A1* | 12/2008 | Adel | G03F 7/70258 355/52 |
| 2011/0043791 A1* | 2/2011 | Smilde | G03F 7/70616 356/128 |
| 2011/0085726 A1* | 4/2011 | Den Boef | G03F 9/7065 382/151 |
| 2011/0096981 A1* | 4/2011 | Arnison | G03F 9/7026 382/151 |
| 2012/0123581 A1* | 5/2012 | Smilde | G03F 7/70483 700/105 |
| 2012/0320359 A1* | 12/2012 | Van Zwet | G03F 7/704 355/67 |
| 2013/0114085 A1* | 5/2013 | Wang | G01N 21/55 356/445 |
| 2013/0169966 A1* | 7/2013 | Shchegrov | G01N 21/4738 356/369 |
| 2014/0136137 A1* | 5/2014 | Tarshish-Shapir | G06T 7/0004 702/108 |
| 2014/0168650 A1* | 6/2014 | Manassen | F21V 9/40 356/432 |
| 2015/0208144 A1* | 7/2015 | Holmes | H04J 14/02 398/48 |
| 2017/0146915 A1 | 5/2017 | Levinski et al. | |
| 2017/0343903 A1 | 11/2017 | Lee et al. | |
| 2017/0350575 A1* | 12/2017 | Hill | G02B 26/0825 |
| 2018/0052099 A1* | 2/2018 | Hill | G01N 21/255 |
| 2018/0087900 A1* | 3/2018 | Paskover | G01N 21/9501 |
| 2018/0292326 A1* | 10/2018 | Manassen | G01B 11/0633 |
| 2019/0026885 A1* | 1/2019 | Gready | G05B 13/024 |
| 2019/0084089 A1* | 3/2019 | Igasaki | B23K 26/705 |

* cited by examiner

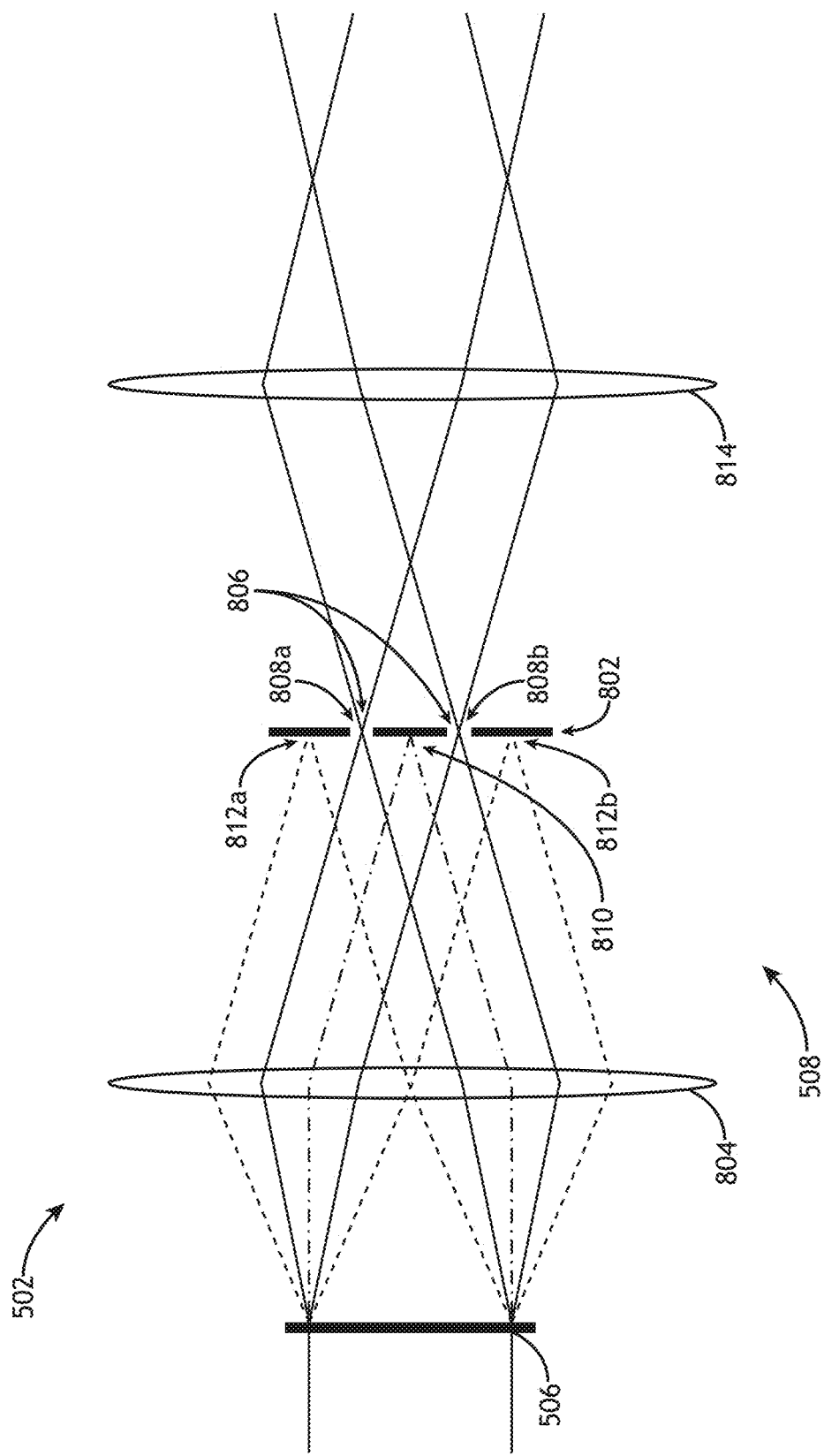

LOCALIZED TELECENTRICITY AND FOCUS OPTIMIZATION FOR OVERLAY METROLOGY

TECHNICAL FIELD

The present disclosure relates generally to the field of overlay metrology and, more particularly, to localized alignment of overlay targets.

BACKGROUND

Image-based overlay metrology may typically include determining relative offsets between two or more layers on a sample based on relative imaged positions of features of an overlay target in the different layers of interest. Accordingly, the accuracy of the overlay measurement may be sensitive to alignment errors of the overlay target in the metrology tool. Typical overlay metrology systems may align a sample once per wafer batch or measurement recipe. However, overlay measurements may be performed at various overlay targets distributed across a sample and the optimal alignment of each overlay target may not be the same due to sample variations, differences in target design, or the like. Accordingly, a single alignment of a sample may result in decreased overlay measurement precision due to localized variations of overlay targets. Therefore, it may be desirable to have systems and methods to efficiently align an overlay metrology system to any selected overlay target on a sample.

SUMMARY

An overlay metrology system is disclosed in accordance with one or more illustrative embodiments of the present disclosure. In one illustrative embodiment, the system includes a controller communicatively coupled to a telecentric imaging system including one or more cameras configured to capture images through an objective lens at two or more focal positions. In another illustrative embodiment, the controller receives two or more alignment images of an overlay target on a sample captured at two or more focal positions by the imaging system in which the two or more alignment images include one or more features of the overlay target. In another illustrative embodiment, the controller generates alignment data indicative of an alignment of the overlay target within the imaging system based on the two or more alignment images. In another illustrative embodiment, the controller sets the two or more alignment images as measurement images when the alignment of the overlay target is within selected alignment tolerances. In another illustrative embodiment, the controller directs the imaging system to adjust the alignment of the overlay target in the imaging system and further receive one or more measurement images from the imaging system when the alignment of the overlay target is outside the selected alignment tolerances. In another illustrative embodiment, the controller determines overlay between two or more layers of the sample based on at least one of the measurement images.

An overlay metrology system is disclosed in accordance with one or more illustrative embodiments of the present disclosure. In one illustrative embodiment, the system includes a telecentric imaging system including one or more cameras configured to capture images through an objective lens at two or more focal positions. In another illustrative embodiment, the system includes a controller communicatively coupled to a telecentric imaging system including one or more cameras configured to capture images through an objective lens at two or more focal positions. In another illustrative embodiment, the controller receives two or more alignment images of an overlay target on a sample captured at two or more focal positions by the imaging system in which the two or more alignment images include one or more features of the overlay target. In another illustrative embodiment, the controller generates alignment data indicative of an alignment of the overlay target within the imaging system based on the two or more alignment images. In another illustrative embodiment, the controller sets the two or more alignment images as measurement images when the alignment of the overlay target is within selected alignment tolerances. In another illustrative embodiment, the controller directs the imaging system to adjust the alignment of the overlay target in the imaging system and further receive one or more measurement images from the imaging system when the alignment of the overlay target is outside the selected alignment tolerances. In another illustrative embodiment, the controller determines overlay between two or more layers of the sample based on at least one of the measurement images.

An overlay metrology method is disclosed in accordance with one or more illustrative embodiments of the present disclosure. In one illustrative embodiment, the method includes receiving two or more alignment images of a sample captured at two or more focal positions by a telecentric imaging system in which the two or more alignment images include one or more features of an overlay target. In another illustrative embodiment, the method includes generating alignment data indicative of an alignment of the overlay target within the imaging system based on the two or more alignment images. In another illustrative embodiment, the method includes setting the two or more alignment images as measurement images when the alignment of the overlay target is within selected alignment tolerances. In another illustrative embodiment, the method includes directing the imaging system to adjust the alignment of the overlay target in the imaging system and further receive one or more measurement images from the imaging system when the alignment of the overlay target is outside the selected alignment tolerances. In another illustrative embodiment, the method includes determining overlay between two or more layers of the sample based on the measurement image.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 8A is a conceptual view of projection optics including a darkfield stop, in accordance with one or more embodiments of the present disclosure.

DETAILED DESCRIPTION

Figure 1A:
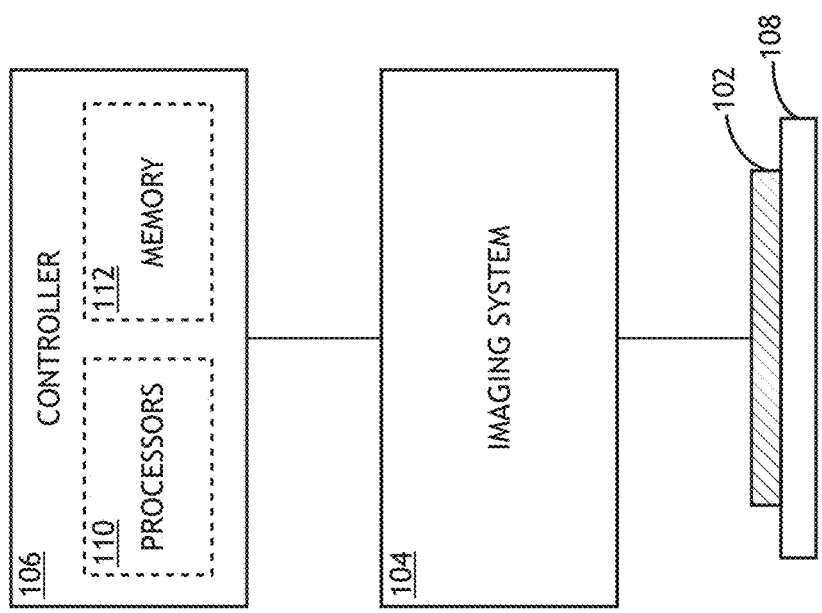
FIG. 1A is a conceptual view illustrating an image-based overlay metrology system suitable for site-by-site alignment, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for site-by-site alignment of an overlay metrology tool. Alignment errors such as, but not limited to, focus errors, telecentricity errors, or centering errors may negatively impact the measurement accuracy of image-based overlay metrology. For example, defocus of a sample may decrease measurement precision due a loss of image contrast. Further, asymmetries of an overlay target may induce focus-dependent overlay errors during measurement. By way of another example, telecentricity errors may induce tool-induced shift (TIS), which may directly negatively impact overlay determinations.

It is recognized herein that optimal alignment of an overlay metrology tool may differ from one overlay target to the next due to a variety of factors such as, but not limited to, sample variations or stage errors. Further, some TIS components such as, but not limited to, sample chuck tilt or rotation stage wobble may rotate with the sample and may thus contribute to measurement inaccuracy when telecentricity is corrected only to minimize non-rotating TIS. Accordingly, embodiments of the present disclosure are directed to alignment of any number of selected overlay targets within an overlay metrology tool prior to or as part of an overlay measurement to provide highly-precise overlay measurements.

It is further recognized herein that metrology tool alignment operations may negatively impact the measurement throughput. Additional embodiments of the present disclosure are directed to efficient alignment of an overlay metrology tool at a selected measurement site (e.g., at a selected overlay target).

Some embodiments of the present disclosure are directed to capturing two or more alignment images of an overlay target with an imaging system at different focal positions and generating alignment data (e.g., focus data, telecentricity data, centering data, or the like) based on the alignment images. For example, alignment data may include data indicative of a difference between the focal positions at which the alignment images were captured and a nominal or target focal position (e.g., a focus error). In one instance, such focus data may include image contrast metrics of the alignment images indicative of focus errors in the alignment images. By way of another example, the alignment data may include lateral shifts of imaged features and/or magnification variations as a function of focal position. Accordingly, this alignment data may be indicative of telecentricity errors of the sample within the imaging system. Further, the alignment data may be used to accurately position (e.g., center) selected features of the overlay target within a field of view of the imaging system.

Additional embodiments of the present disclosure are directed to aligning the sample in the imaging system within selected alignment tolerances (e.g., focus tolerances, telecentricity tolerances, centering tolerances, or the like) based on the alignment data. Accordingly, an overlay metrology tool may be aligned to any number of selected overlay targets on a sample prior to generating overlay measurements on the selected overlay targets to facilitate robust and accurate overlay measurements for each target.

For example, the sample (or one or more features one a selected layer of the sample) may be aligned to be in focus on a selected camera of the imaging system based on the focus data. In this regard, one or more elements of the imaging system such as, but not limited to a sample stage, a position of an objective lens, or the like may be adjusted to focus the sample within the selected focus tolerances (e.g., a range of focus positions providing a desired image quality). By way of another example, one or more components of the imaging system such as, but not limited to, an aperture stop may be adjusted to provide telecentric imaging of the sample within the selected telecentricity tolerances (e.g., allowable deviations of the lateral position, magnification, or the like of imaged features).

Additional embodiments are directed to capturing a measurement of the sample after aligning the sample based on the alignment data. Further embodiments are directed to determining overlay between two or more layers of the sample based on the measurement image. In this regard, a highly precise overlay measurement may be generated for each overlay target.

FIG. 1A is a conceptual view illustrating an image-based overlay metrology system 100 suitable for site-by-site alignment, in accordance with one or more embodiments of the present disclosure. For example, the overlay metrology system 100 may determine overlay (e.g., overlay errors) between two or more layers of a sample 102 based on images of overlay targets distributed across the sample 102.

In one embodiment, the overlay metrology system 100 includes a telecentric imaging system 104 to generate one or more images of the sample 102 and a controller 106 to determine overlay of two or more layers of the sample 102 based on images from the imaging system 104. Further, overlay metrology system 100 may include a sample stage 108 for positioning selected portions of the sample 102 (e.g., selected overlay targets) within a field of view of the imaging system 104 for the determination of overlay. The sample stage 108 may include any device suitable for positioning the sample 102 within the overlay metrology system 100. For example, the sample stage 108 may include any combination of linear translation stages, rotational stages, tip/tilt stages or the like.

In another embodiment, the imaging system 104 includes one or more adjustable components suitable for aligning a portion of the sample 102 within the selected alignment tolerances. For example, the adjustable components may include, but are not limited to, the sample stage 108, one or more aperture stops, or one or more additional translation stages suitable for adjusting optical components.

In another embodiment, the controller 106 includes one or more processors 110 configured to execute program instructions maintained on a memory medium 112. In this regard, the one or more processors 110 of controller 106 may execute any of the various process steps described throughout the present disclosure. Further, the controller 106 may be communicatively coupled to any component of the overlay metrology system 100. For example, the controller 106 may be communicatively coupled to the imaging system 104 to receive images from the imaging system 104 and/or control the adjustable components of the imaging system 104 to align the sample 102 within selected alignment tolerances. Further, the controller 106 may determine overlay associated with two or more layers of the sample 102 based on images received from the imaging system 104.

The one or more processors 110 of a controller 106 may include any processing element known in the art. In this sense, the one or more processors 110 may include any microprocessor-type device configured to execute algorithms and/or instructions. In one embodiment, the one or more processors 110 may consist of a desktop computer, mainframe computer system, workstation, image computer, parallel processor, or any other computer system (e.g., networked computer) configured to execute a program configured to operate the overlay metrology system 100, as described throughout the present disclosure. It is further recognized that the term "processor" may be broadly defined to encompass any device having one or more processing elements, which execute program instructions from a non-transitory memory medium 112. Further, the steps described throughout the present disclosure may be carried out by a single controller 106 or, alternatively, multiple controllers. Additionally, the controller 106 may include one or more controllers housed in a common housing or within multiple housings. In this way, any controller or combination of controllers may be separately packaged as a module suitable for integration into overlay metrology system 100. Further, the controller 106 may analyze data received from the detector assembly 122 and feed the data to additional components within the overlay metrology system 100 or external to the overlay metrology system 100.

The memory medium 112 may include any storage medium known in the art suitable for storing program instructions executable by the associated one or more processors 110. For example, the memory medium 112 may include a non-transitory memory medium. By way of another example, the memory medium 112 may include, but is not limited to, a read-only memory, a random access memory, a magnetic or optical memory device (e.g., disk), a magnetic tape, a solid state drive and the like. It is further noted that memory medium 112 may be housed in a common controller housing with the one or more processors 110. In one embodiment, the memory medium 112 may be located remotely with respect to the physical location of the one or more processors 110 and controller 106. For instance, the one or more processors 110 of controller 106 may access a remote memory (e.g., server), accessible through a network (e.g., internet, intranet and the like). Therefore, the above description should not be interpreted as a limitation on the present invention but merely an illustration.

Figure 1B:
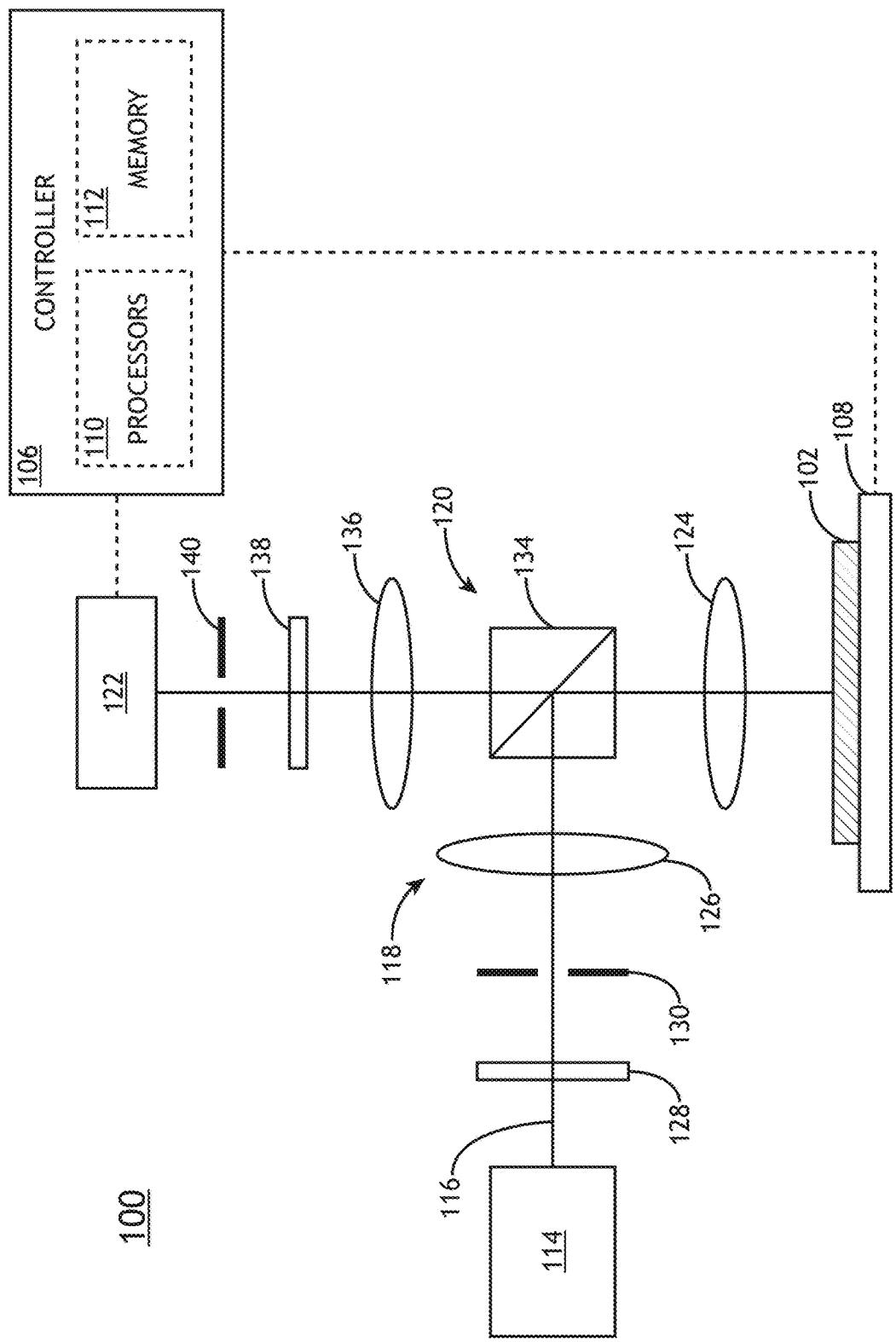
FIG. 1B is a conceptual view of an imaging overlay metrology system, in accordance with one or more embodiments of the present disclosure.

FIG. 1B is a conceptual view of an imaging overlay metrology system 100, in accordance with one or more embodiments of the present disclosure.

In another embodiment, the overlay metrology system 100 includes an illumination source 114 to generate an illumination beam 116, an illumination pathway 118 to direct the illumination beam 116 to the sample 102 mounted on the sample stage 108, a collection pathway 120 to direct radiation emanating from the sample 102 to a detector assembly 122. For example, the detector assembly 122 may include at least one imaging detector suitable for capturing an image of the sample 102.

The illumination beam 116 may include one or more selected wavelengths of light including, but not limited to, vacuum ultraviolet radiation (VUV), deep ultraviolet radiation (DUV), ultraviolet (UV) radiation, visible radiation, or infrared (IR) radiation. The illumination source 114 may further generate an illumination beam 116 including any range of selected wavelengths. In another embodiment, the illumination source 114 may include a spectrally-tunable illumination source to generate an illumination beam 116 having a tunable spectrum. The illumination source 114 may further produce an illumination beam 116 having any temporal profile. For example, the illumination source 114 may produce a continuous illumination beam 116, a pulsed illumination beam 116, or a modulated illumination beam 116. Additionally, the illumination beam 116 may be delivered from the illumination source 114 via free-space propagation or guided light (e.g. an optical fiber, a light pipe, or the like).

The illumination source 114 may include any type of illumination source suitable for providing an illumination beam 116. In one embodiment, the illumination source 114 is a laser source. For example, the illumination source 114 may include, but is not limited to, one or more narrowband laser sources, a broadband laser source, a supercontinuum laser source, a white light laser source, or the like. In this regard, the illumination source 114 may provide an illumination beam 116 having high coherence (e.g., high spatial coherence and/or temporal coherence). In another embodiment, the illumination source 114 includes a laser-sustained plasma (LSP) source. For example, the illumination source 114 may include, but is not limited to, a LSP lamp, a LSP bulb, or a LSP chamber suitable for containing one or more elements that, when excited by a laser source into a plasma state, may emit broadband illumination. In another embodiment, the illumination source 114 includes a lamp source. For example, the illumination source 114 may include, but is not limited to, an arc lamp, a discharge lamp, an electrodeless lamp, or the like. In this regard, the illumination source 114 may provide an illumination beam 116 having low coherence (e.g., low spatial coherence and/or temporal coherence).

In another embodiment, the illumination source 114 directs the illumination beam 116 to a sample 102 via the illumination pathway 118. For example, the illumination pathway 118 may include an objective lens 124 to focus the illumination beam 116 onto the sample 102. The illumination pathway 118 may include one or more illumination pathway lenses 126 or illumination conditioning components 128 suitable for modifying and/or conditioning the illumination beam 116. For example, the one or more illumination conditioning components 128 may include, but are not limited to, one or more polarizers, one or more filters, one or more beam splitters, one or more diffusers, one or more homogenizers, one or more apodizers, or one or more beam shapers. By way of another example, the illumination pathway 118 may include aperture stops to control the angle of illumination on the sample 102 and/or field stops to control the spatial extent of illumination on the sample 102.

Figure 1C:
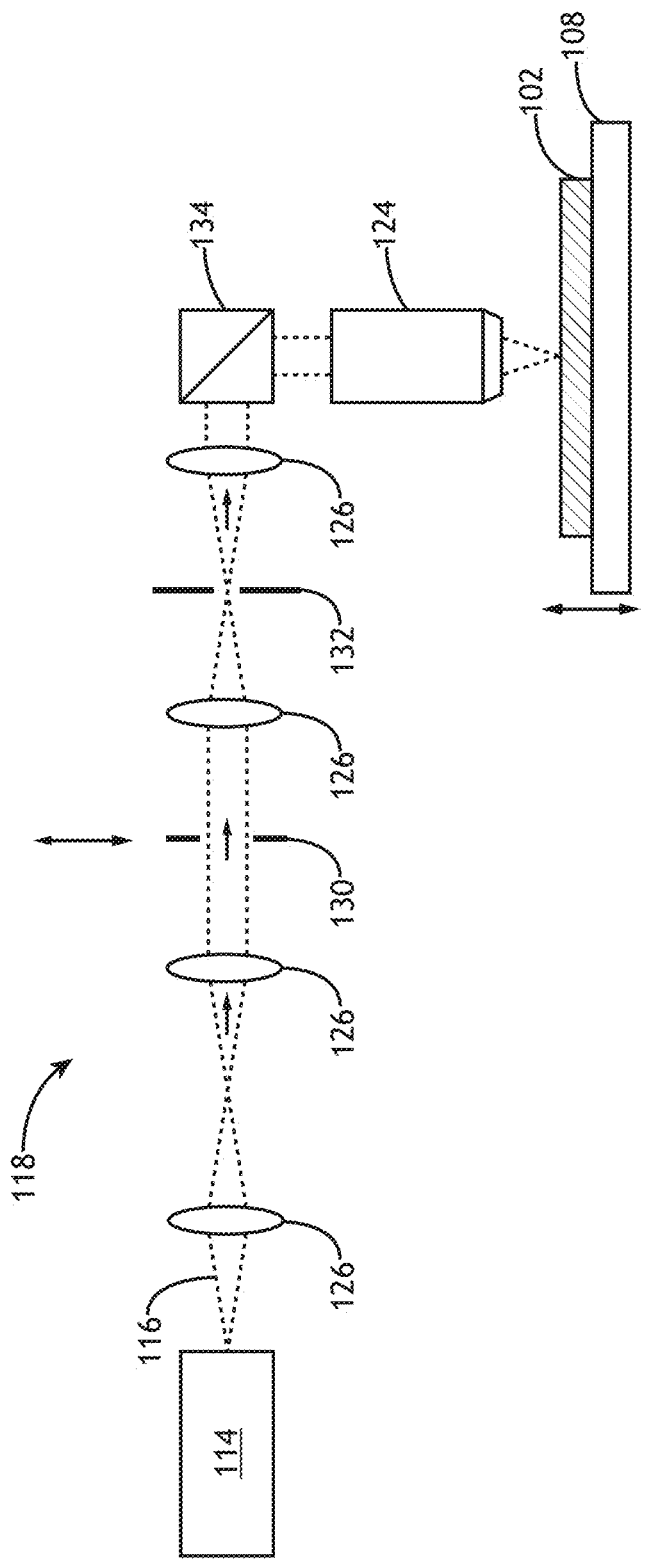
FIG. 1C is a conceptual view of an illumination pathway with an adjustable illumination aperture stop, in accordance with one or more embodiments of the present disclosure.

FIG. 1C is a conceptual view of an illumination pathway 118 with an adjustable illumination aperture stop 130, in accordance with one or more embodiments of the present disclosure.

In one embodiment, the illumination pathway 118 includes an illumination aperture stop 130 to provide telecentric illumination of the sample. For example, the illumination aperture stop 130 may be located at a plane conjugate to the back focal plane of the objective lens 124 and/or a tube lens (not shown). In another embodiment, the illumination pathway 118 includes an illumination field stop 132 to control the spatial extent of illumination on the sample 102 to be directed to the sample 102. For example, the illumination field stop 132 may be located at a plane conjugate to the sample 102. Further, the illumination pathway 118 may include any number of illumination pathway lenses 126 that facilitate placement of the illumination aperture stop 130 and the illumination field stop 132 at convenient locations.

Referring again to FIG. 1B, the collection pathway 120 may include any number of optical elements to collect radiation emanating from the sample (e.g., in response to the illumination beam 116) and direct the collected radiation to the detector assembly 122. In one embodiment, the collection pathway 120 includes a beamsplitter 134 oriented such that the objective lens 124 may simultaneously direct the illumination beam 116 to the sample 102 and collect radiation from the sample 102. The collection pathway 120 may further include one or more collection pathway lenses 136 and/or conditioning collection components 138 suitable for modifying and/or conditioning the radiation from the sample 102 such as, but not limited to, one or more filters, one or more polarizers, or one or more beam blocks. Additionally, the collection pathway 120 may include aperture stops to control the angular extent of radiation collected from the sample 102 and/or field stops to control the spatial extent of an image of the sample 102. In another embodiment, the collection pathway 120 includes a stop 140. For example, the stop 140 may include a collection aperture stop located in a plane conjugate to the back focal plane of the objective lens 124 and/or a tube lens (not shown) to provide image-space telecentricity when imaging the sample 102. By way of another example, the stop 140 may include a collection field stop located at a plane conjugate to the sample 102 to control the spatial extent of the image on the detector assembly 122. Further, the collection pathway 120 may include any number of illumination pathway lenses 126 that facilitate placement of the stop 140 and the collection field stop at convenient locations.

The detector assembly 122 may include any number of detectors suitable for capturing radiation emanating from the sample 102. For example, the detector assembly 122 may include one or more imaging detectors suitable for generating images at selected focal positions. For instance, an imaging detector may include, but is not limited to, a charge-coupled device (CCD), a complementary metal-oxide-semiconductor (CMOS) device, a time delay imaging (TDI) detector, one or more photomultiplier tubes (PMT), one or more avalanche photodiodes (APD), or the like. In another embodiment, the detector assembly 122 may include a spectroscopic detector suitable for identifying wavelengths of radiation emanating from the sample 102.

Figure 2:
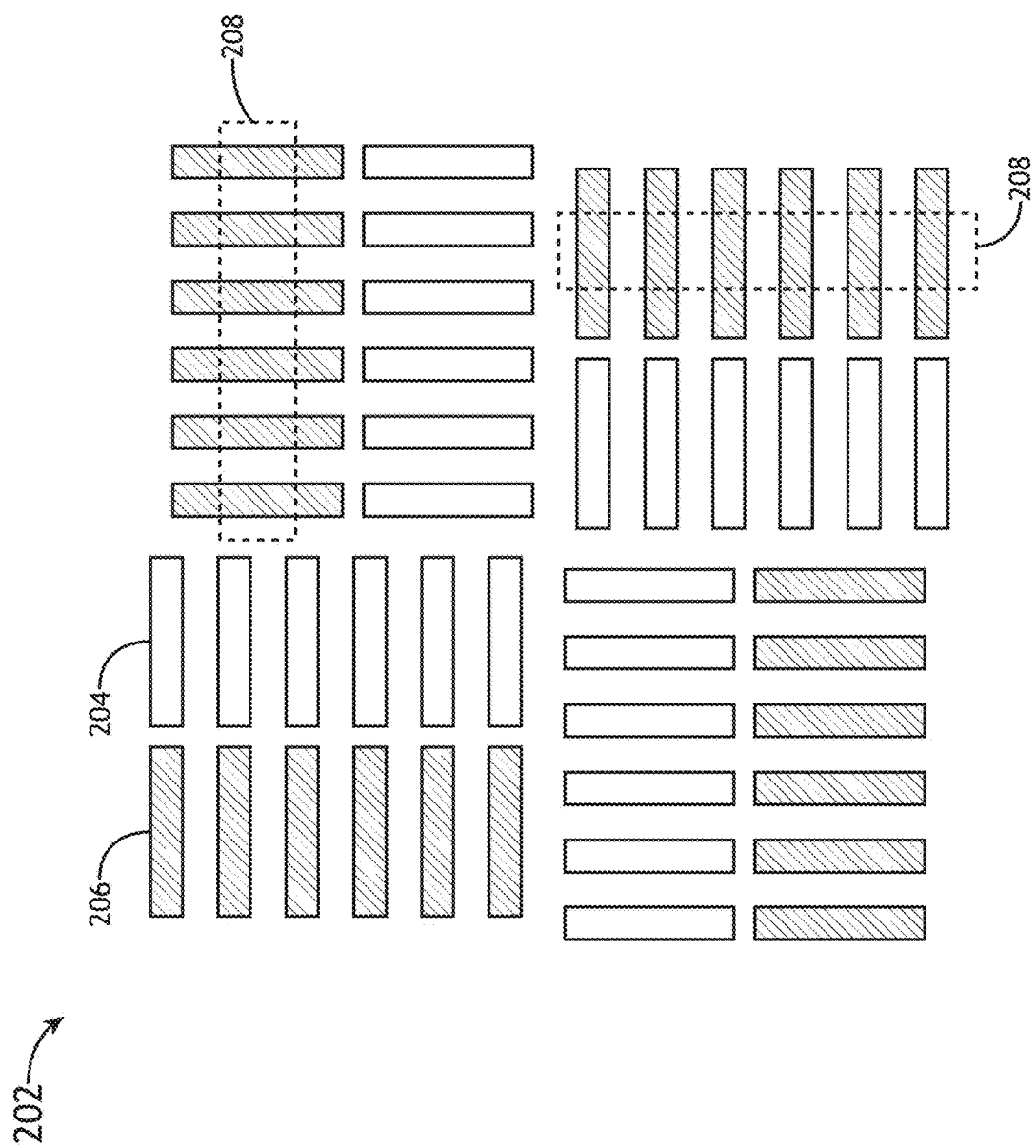
FIG. 2 is a top view of an overlay target suitable for image-based overlay metrology, in accordance with one or more embodiments of the present disclosure.

Referring now to FIGS. 2 though 8B, site by site alignment is generally described.

In one embodiment, the overlay metrology system 100 performs site-by-site alignment of the imaging system 104. For example, the overlay metrology system 100 may perform overlay measurements at a multitude of overlay targets distributed across the sample 102 and may further individually align the imaging system 104 for any selected number the overlay targets. For example, an overlay measurement of an overlay target may typically begin with translating the overlay target to the field of view of the imaging system 104 (e.g., with the sample stage 108). However, physical variations of the sample 102 and/or errors of the sample stage 108 may lead to alignment errors that may negatively impact the accuracy of an overlay measurement if not corrected.

FIG. 2 is a top view of an overlay target 202 suitable for image-based overlay metrology, in accordance with one or more embodiments of the present disclosure. In one embodiment, the overlay target 202 includes an advanced imaging metrology (AIM) overlay target. For example, an overlay target 202 may include one or more first-layer features 204 on a first layer of the sample 102 and one or more second-layer features 206 on a second layer of the sample 102. In this regard, the overlay between the first layer and the second layer may be determined based on the relative positions of the first-layer features 204 and the second-layer features 206.

Further, the first-layer features 204 and/or the second-layer features 206 may be oriented to facilitate overlay measurements in orthogonal directions. For example, as illustrated in FIG. 2, the overlay target 202 may include four quadrants in which a portion first-layer features 204 and the second-layer features 206 are aligned along a first direction and a portion of the first-layer features 204 and the second-layer features 206 are oriented along a second direction orthogonal to the first direction. Further, the first-layer features 204 and the second-layer features 206 may be, but are not required to be, segmented.

It is to be understood that the overlay target 202 depicted in FIG. 2 and the associated description are provided solely for illustrative purposes and should not be interpreted as limiting. For example, an overlay target may include features on any number of layers of the sample 102 (e.g., 3 layers, 4, layers, or the like). By way of another example, features of an overlay target may be oriented in any selected pattern suitable for image-based overlay measurements such as, but not limited to, a box-in-box pattern or a grating-over-grating pattern.

Alignment errors may be associated with any type of alignment metric that may impact an overlay measurement from an overlay target (e.g., overlay target 202) such as, but not limited to, focus errors and telecentricity errors. For example, focus errors may be associated with a deviation of the height of the overlay target with respect to a nominal focal position such that an image of the overlay target is out of focus. Defocus in a measurement image may negatively impact overlay measurements in a variety of ways such as, but not limited to, reducing the image contrast and the measurement precision of feature edges. By way of another example, telecentricity errors may give rise to TIS. In this regard, the apparent positions of features may appear to laterally shift as a function of focal position in the imaging system 104, which may induce overlay offset errors.

In one embodiment, the imaging system 104 generates two or more alignment images from the imaging system 104 at different focal positions for each selected overlay measurement site (e.g., each selected overlay target). It is recognized herein that alignment images at two or more focal positions may provide sufficient information to accurately determine alignment errors (e.g., focus errors, telecentricity errors, centering errors, or the like) and thus facilitate mitigation of the alignment errors on a site-by-site basis. The controller 106 may then generate alignment data based on the alignment images and then direct the imaging system 104 to align the sample 102 within selected alignment tolerances in the case that the sample 102 is outside of the alignment tolerances at the selected site. Once the imaging system 104 is aligned, the imaging system 104 may generate a measurement image and the controller 106 may provide overlay measurements for two or more layers of the sample 102 based on the measurement image.

Figure 3:
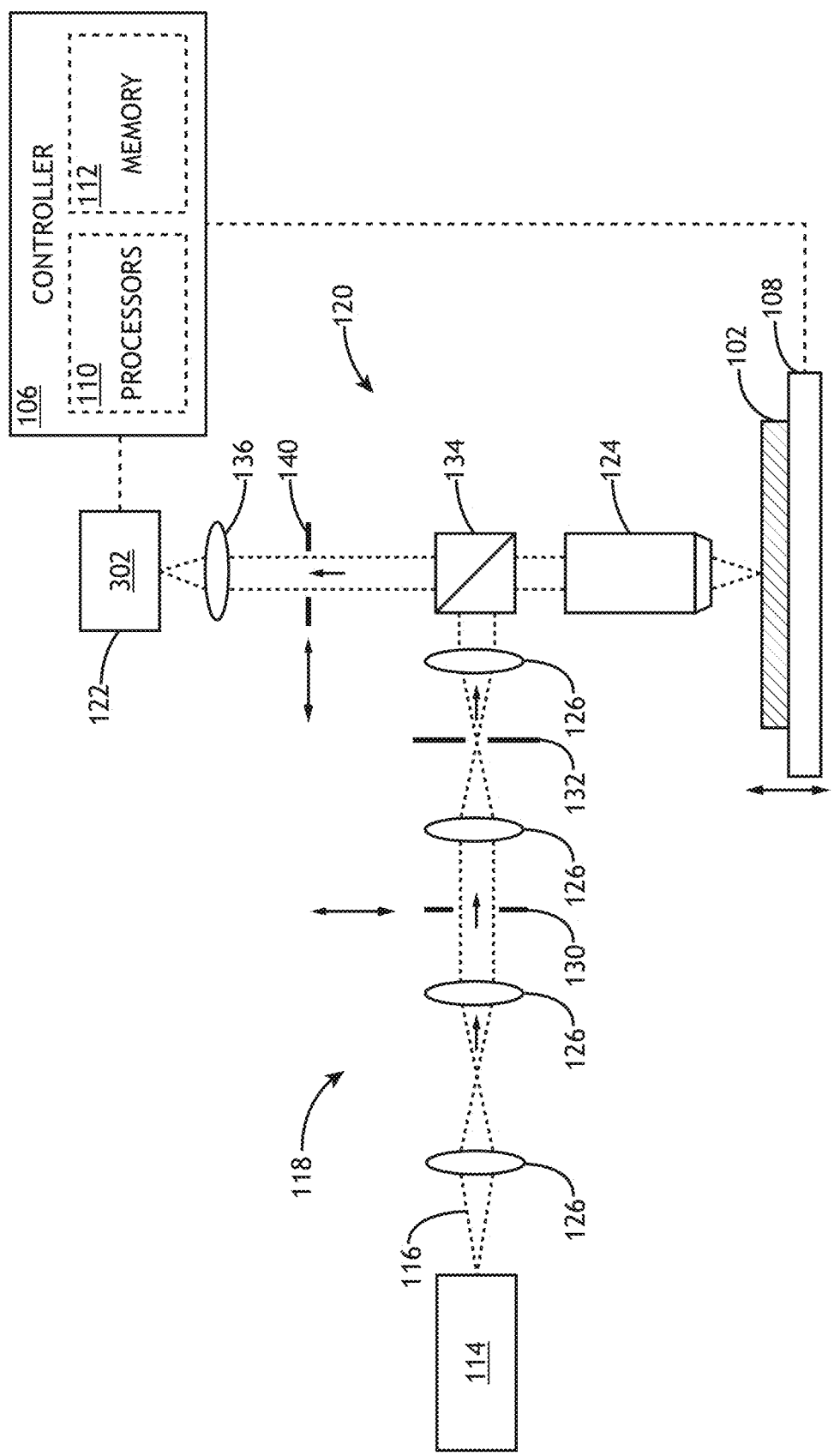
FIG. 3 is a conceptual view of an imaging system suitable for capturing sequential alignment images, in accordance with one or more embodiments of the present disclosure.

The imaging system 104 may capture the alignment images sequentially or simultaneously. FIG. 3 is a conceptual view of an imaging system 104 suitable for capturing sequential alignment images, in accordance with one or more embodiments of the present disclosure. In one embodiment, the detector assembly 122 of the imaging system 104 includes a single imaging detector 302. Accordingly, the imaging system 104 may capture alignment images by sequentially modifying the focal position of the sample 102 and capturing images with the imaging detector 302.

The focal position of sample 102 within the imaging system 104 may be controlled using any combination of elements. For example, the focal position of the sample 102 may be adjusted via the sample stage 108. By way of another example, the focal position of the sample 102 may be controlled by adjusting a position of one or more elements of the collection pathway 120 such as, but not limited to, the objective lens 124 or the imaging detector 302.

Figure 4:
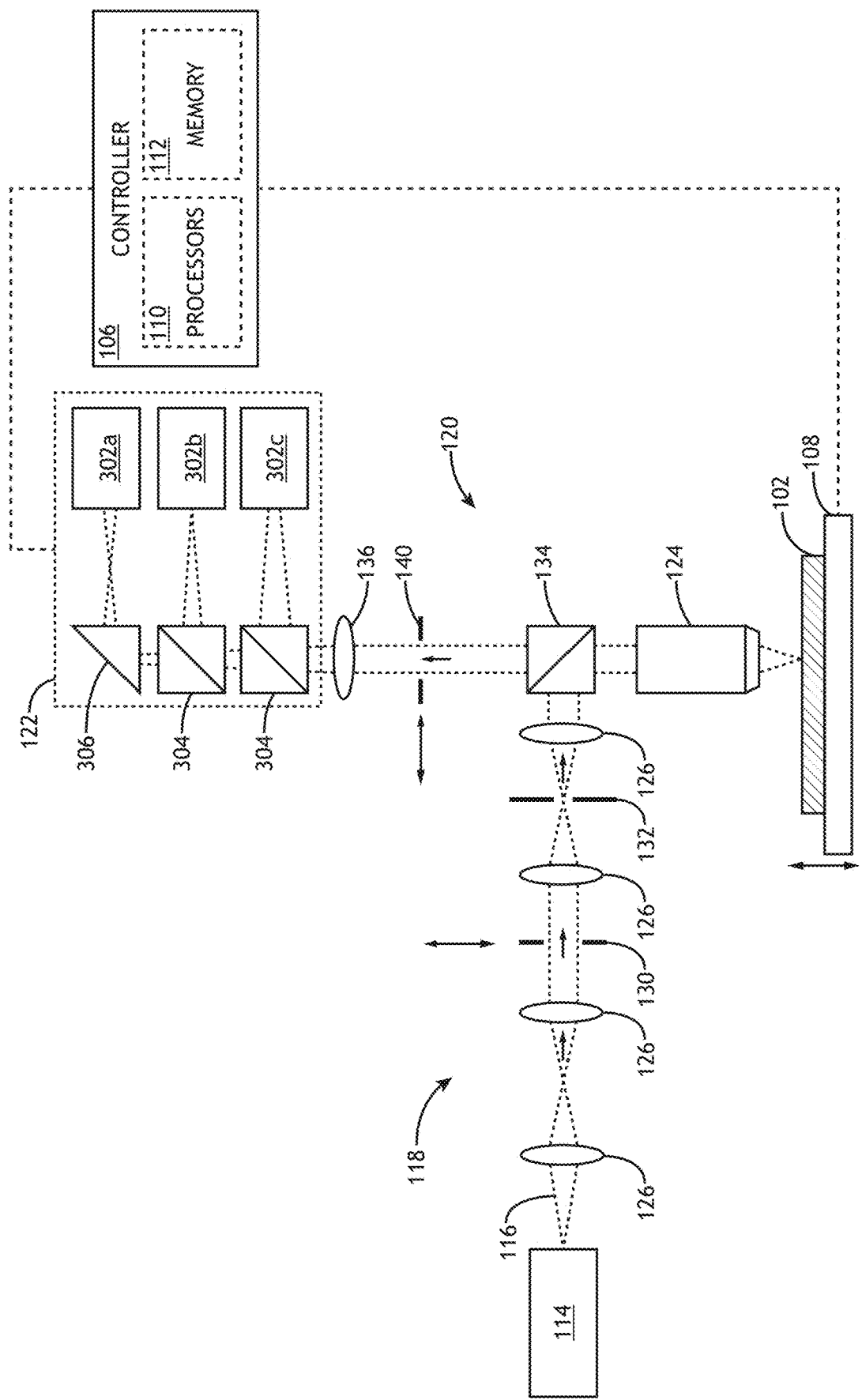
FIG. 4 is a conceptual view of an imaging system suitable for capturing simultaneous alignment images, in accordance with one or more embodiments of the present disclosure.

FIG. 4 is a conceptual view of an imaging system 104 suitable for capturing simultaneous alignment images, in accordance with one or more embodiments of the present disclosure. In one embodiment, the detector assembly 122 includes two or more imaging detectors configured to simultaneously capture images at selected focal positions. For example, as illustrated in FIG. 4, the detector assembly 122 may include three imaging detectors 302a-c to simultaneously capture three images of the sample 102 at three selected focal positions. The detector assembly 122 may further include detector optical elements to split and direct the radiation emanating from the sample 102 along multiple paths to be captured by the imaging detectors 302 such as, but not limited to, one or more beamsplitters 304, one or more prisms 306, one or more mirrors (not shown), or one or more detector lenses (not shown).

The detector assembly 122 may be configured to capture images at any selected focal positions. In one embodiment, the detector assembly 122 includes one imaging detector configured to capture images at a nominal (e.g., ideal) focal position at which the sample 102 is expected to be aligned and one or more additional imaging detectors configured to capture images at selected offsets from the nominal focal position. For example, as illustrated in FIG. 4, imaging detector 302b may be configured to capture images at the nominal focal position, imaging detector 302a may be configured to capture images at a selected positive offset from the nominal focal position, and imaging detector 302c may be configured to capture images at a selected negative offset from the nominal focal position. The nominal focal position may additionally correspond to an aberration-correcting imaging configuration based on the specifications of the objective lens 124.

The alignment data extracted from the alignment images may include any type of data suitable for providing correctables to align a selected overlay target within the imaging system 104. In one embodiment, the alignment data includes focus data indicative of the relative defocus of the alignment images such as, but not limited to the image contrast. Such data may then be used (e.g., by the controller 106) to accurately adjust the focal position of the sample such that the selected overlay target is in focus on a selected camera of the detector assembly 122 (e.g., the single imaging detector 302 of FIG. 3, the nominal imaging detector 302b of FIG. 4, or the like).

For example, images of an overlay target (e.g., overlay target 202) may typically include a high image contrast including the first-layer features 204 and the second-layer features 206 visible against a background. Further, the image contrast may typically be highest when the overlay target is in focus and may typically decrease with increasing defocus. Image contrast data associated with a difference in image intensity (e.g., pixel value) between the features of the overlay target and the background for each alignment image may thus be indicative of the relative defocus associated with each alignment image. Accordingly, focus data associated with two or more alignment images may be utilized (e.g., by the controller 106) to adjust a focal position for the overlay target such that the selected overlay target is in focus within selected focus tolerances (e.g., a selected range of focal positions providing a desired image quality, or the like) on a selected camera of the detector assembly 122 (e.g., the single imaging detector 302 of FIG. 3, the nominal imaging detector 302b of FIG. 4, or the like).

In another embodiment, focus data from the alignment images is compared against calibrated focus data to adjust the focal position for the overlay target 202 within selected focus tolerances. For example, calibrated focus data may include, but is not limited to, image contrast data as a function of defocus on either side of a nominal focal position (e.g., a through-focus curve). Further, the calibrated focus data may be generated with a finer resolution of focal positions than provided by the two or more alignment images. In this regard, the focus data of the alignment images may be mapped to points of the calibrated focus data to provide efficient determination of the nominal focus for an overlay measurement.

The calibrated focus data may be generated in any manner. For instance, the calibrated focus data may be generated through a series of training images of an overlay target (e.g., overlay target 202) at or prior to runtime. In another instance, the calibrated focus data may be generated through a series of simulations.

In another embodiment, the alignment data includes telecentricity data indicative of a telecentricity error of the selected overlay target (e.g., overlay target 202). For example, telecentricity error may manifest as a variation of feature size (e.g., variation of image magnification) as a function of focal position. By way of another example, telecentricity error may manifest as a lateral shift of features when imaged at different focal positions. Accordingly, telecentricity data may include relative location information of features in the overlay target. Further, the magnitude and/or the direction of the lateral shifts may then be used to correct the telecentricity errors.

Telecentricity errors may be determined based on two or more alignment images captured at different focal positions either sequentially or simultaneously. For example, in the case that the alignment images are captured on a single imaging detector 302 (e.g., in the configuration of or similar to FIG. 3), the telecentricity data may include position and/or orientation information of selected features of the overlay target in each of the alignment images. In one instance, the position and/or orientation information may be represented in terms of the pixel locations of the features.

By way of another example, in the case that the alignment images are generated with multiple imaging detectors 302 (e.g., in the configuration of or similar to FIG. 4), the position and/or orientation information of the selected features of the overlay target may be referenced to calibrated positions on each camera. For example, relative variations and/or instabilities in the positions of the multiple imaging detectors 302 may negatively impact the ability to accurately measure positional shifts of features across different focal positions.

In one embodiment, the imaging system 104 includes a pattern projector to project one or more reference patterns directly onto the two or more imaging detectors 302. In this regard, the projected reference patterns may be used to calibrate the imaging detectors 302 with respect to each other and further provide a reference from which to measure the positions of selected features of the overlay target for each alignment image.

Figure 5:
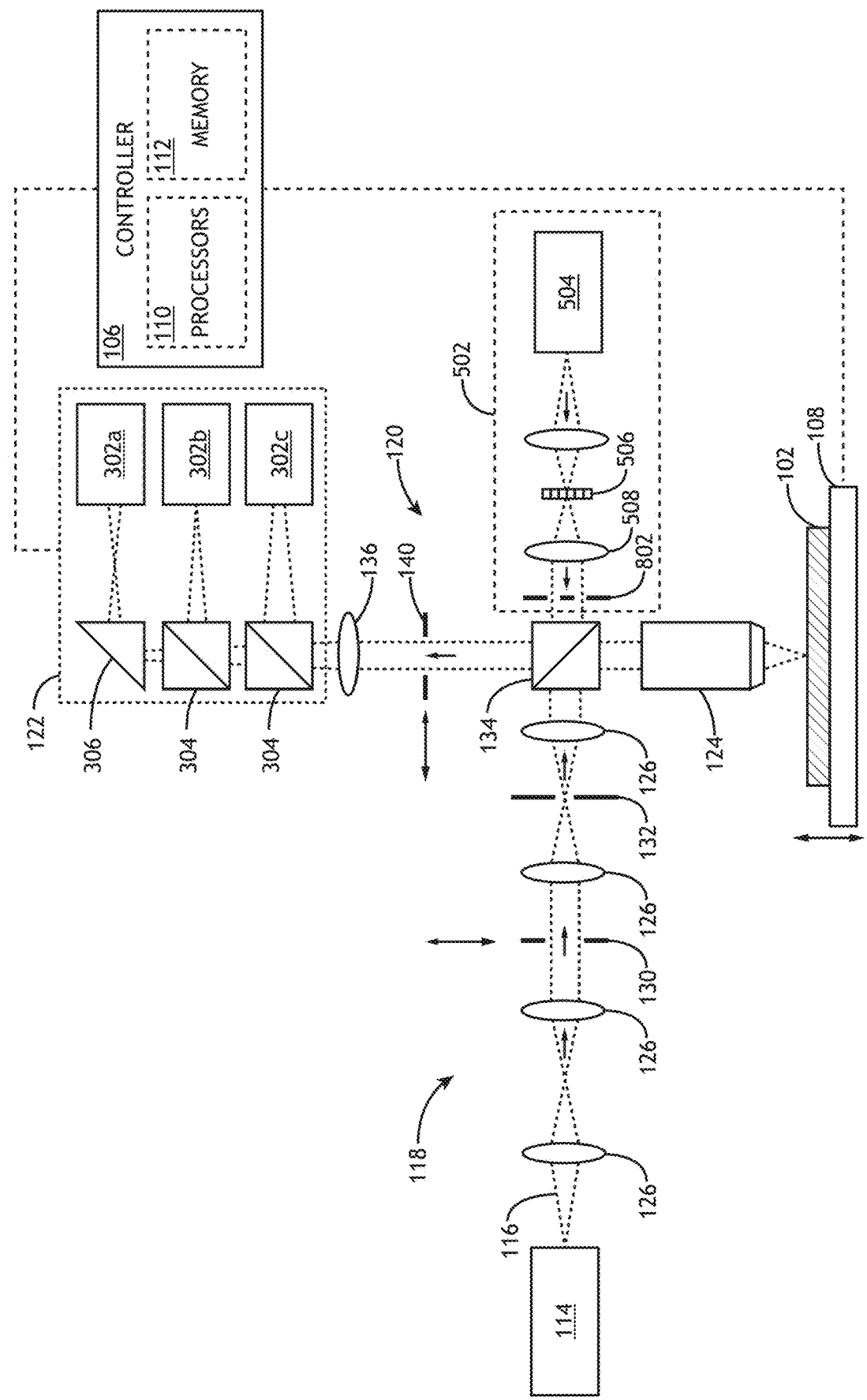
FIG. 5 is a conceptual view of a pattern projector integrated into an imaging system, in accordance with one or more embodiments of the present disclosure.

FIG. 5 is a conceptual view of a pattern projector 502 integrated into an imaging system 104, in accordance with one or more embodiments of the present disclosure. In one embodiment, the pattern projector 502 includes a projector illumination source 504 configured to generate a beam of illumination, a pattern mask 506, and projection optics 508 to generate an image of the pattern mask 506 onto the imaging detectors 302. For example, illumination passed by the pattern mask 506 may be directed by the beamsplitter 134 directly to the imaging detectors 302.

Figure 6:
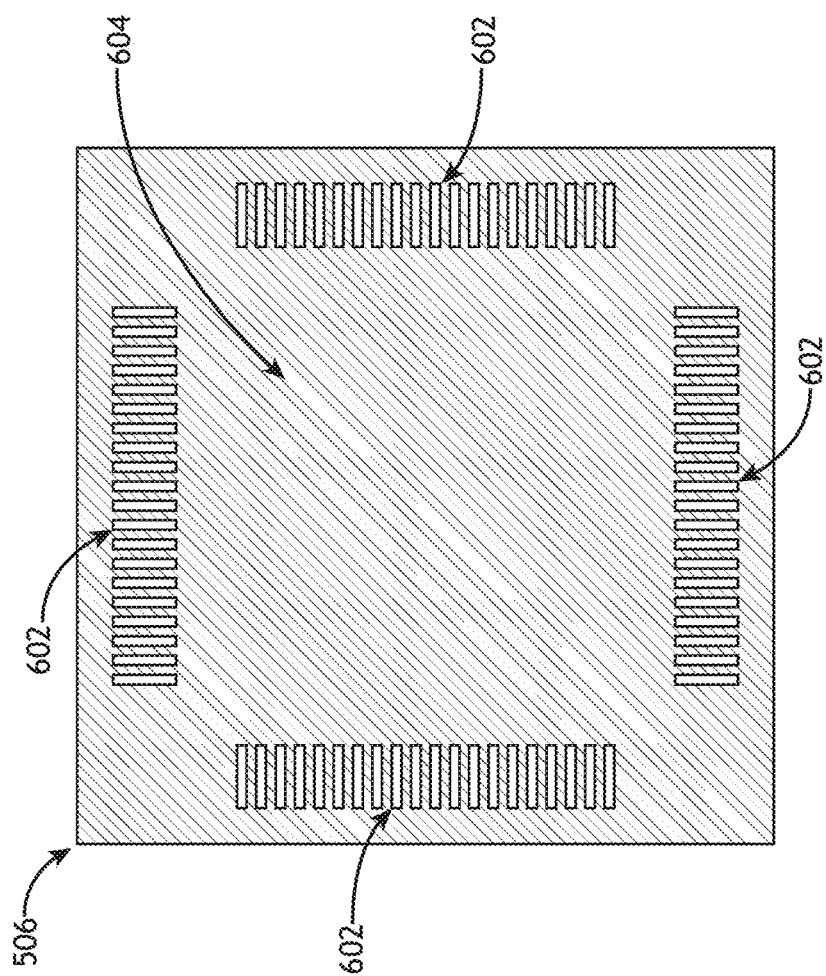
FIG. 6 is a top view of a pattern mask, in accordance with one or more embodiments of the present disclosure.

FIG. 6 is a top view of a pattern mask 506, in accordance with one or more embodiments of the present disclosure. The pattern mask 506 includes one or more patterns 602 to be projected onto the imaging detectors 302. Further, the patterns 602 may include any distribution of pattern elements suitable for monitoring the relative lateral positions of the overlay target on the detector assembly 122.

In one embodiment, the pattern mask 506 includes grating structures oriented along orthogonal directions to facilitate monitoring of the imaging detectors 302 along the orthogonal directions. For example, as illustrated in FIG. 6, a pattern mask 506 may include at least one grating pattern with elements distributed along a first direction and at least one grating pattern with elements distributed along a second direction orthogonal to the first direction.

Figure 7:
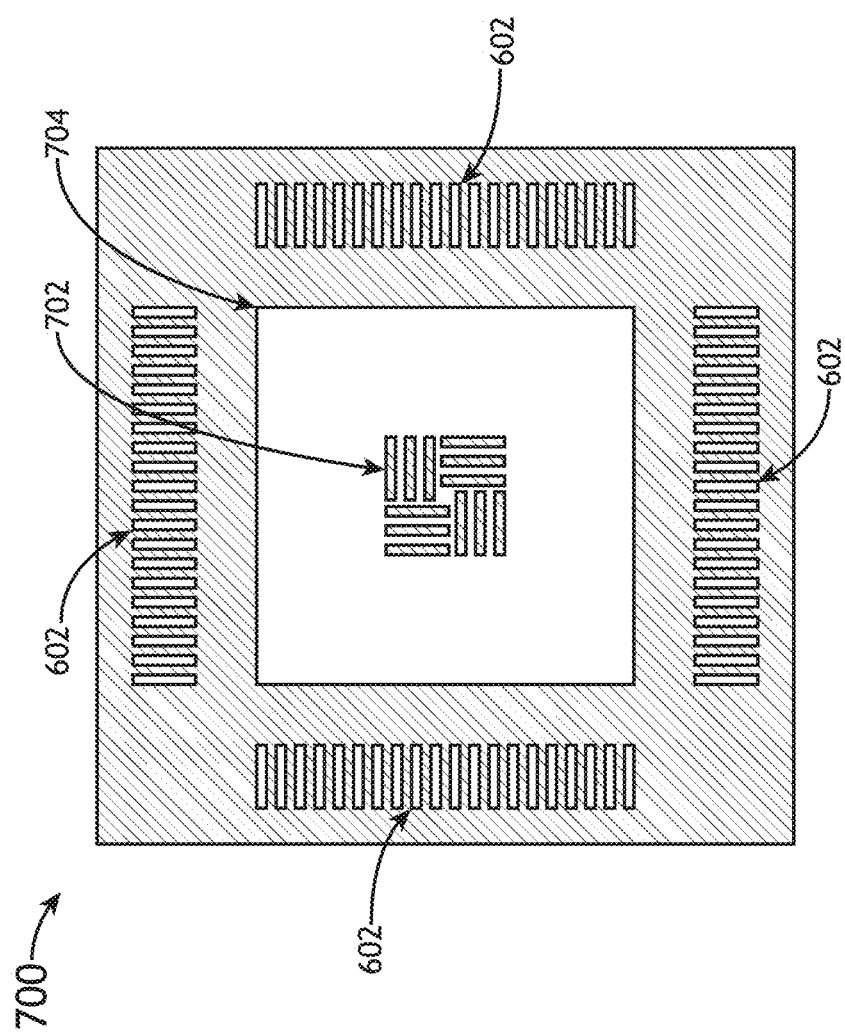
FIG. 7 is a conceptual image of an overlay target superimposed with projected images of patterns from the pattern mask of FIG. 6, in accordance with one or more embodiments of the present disclosure.

The patterns 602 may further be configured to be projected onto any portion of the imaging detectors 302. In one embodiment, as illustrated in FIG. 6, the patterns 602 may be placed along outer regions of the pattern mask 506, leaving a central open area 604 for the imaging of the selected overlay target. FIG. 7 is a conceptual image 700 of an overlay target 702 superimposed with projected images of patterns 602 from the pattern mask 506 of FIG. 6, in accordance with one or more embodiments of the present disclosure. For example, the image 700 of FIG. 7 may be captured by any imaging detector of the detector assembly 122 (e.g., imaging detector 302 of FIG. 4, or any of imaging detectors 302a-c) of FIG. 5).

In one embodiment, the overlay target 702 is visible in the central portion of the image 700, while the patterns 602 are visible on outer regions of the image 700. Further, the patterns 602 may be projected to portions of the imaging detectors of the detector assembly 122 not associated with the image of the overlay target 702. For example, the overlay target 702 is visible as black features on a white background, where the boundaries 704 of the white background (e.g., a square in FIG. 7) may be controlled using the collection field stop of the imaging system 104.

The projection optics 508 may include any combination of optical elements suitable for projecting an image of the pattern mask 506 onto the imaging detectors 302 such as, but not limited to, lenses or stops. In one embodiment, the projection optics 508 includes a darkfield mask to control and/or select the diffraction orders used to generate images of the patterns 602 on the imaging detectors. For example, it is recognized herein that it may be desirable to project an in-focus image of the pattern mask 506 on each of the imaging detectors 302 of the detector assembly 122. However, the optical path lengths between the pattern mask 506 and the individual imaging detectors 302 may not be the same (e.g., see FIG. 7). It is further recognized herein that images of grating structures (e.g., the grating patterns 602 on the pattern mask 506 illustrated in FIG. 6) formed by only two diffraction orders of equal amplitude may have a high contrast through a large depth of field.

Figure 8B:
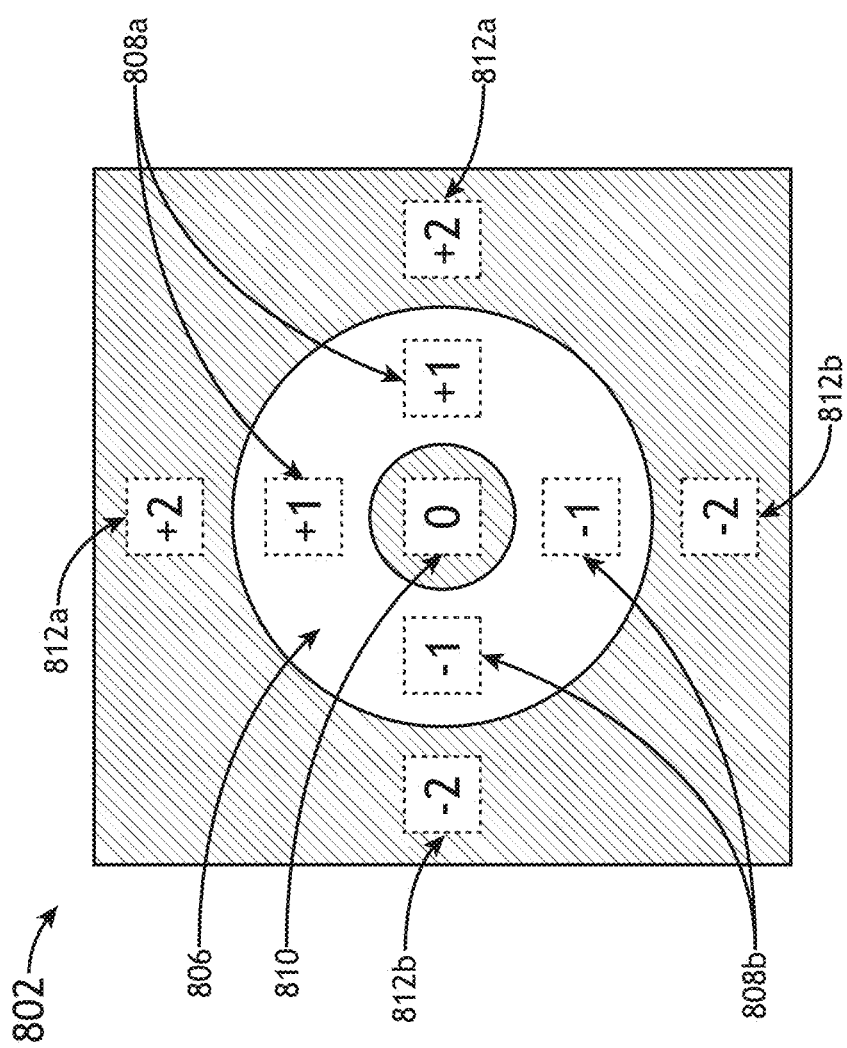
FIG. 8B is a top view of a darkfield stop configured to select first-order diffraction, in accordance with one or more embodiments of the present disclosure.

FIGS. 8A and 8B illustrate projection optics 508 with a darkfield filter configured to pass only first-order diffraction (e.g., +/−1 diffraction orders) from the pattern mask 506. FIG. 8A is a conceptual view of projection optics 508 including a darkfield stop 802, in accordance with one or more embodiments of the present disclosure. FIG. 8B is a top view of a darkfield stop 802 configured to select first-order diffraction (e.g., +/−1 diffraction orders), in accordance with one or more embodiments of the present disclosure.

In one embodiment, the projection optics 508 of the pattern projector 502 include a darkfield stop 802 located at a diffraction plane of a projection lens 804. In this regard, the darkfield stop 802 may operate as a spatial filter to pass selected diffraction orders of illumination from the projector illumination source 504 diffracted by the pattern mask 506. For example, as illustrated in FIGS. 8A and 8B, the darkfield stop 802 may include an annular transmissive portion 806 configured to pass the first-order diffraction order (e.g., +1 diffraction order 808a and −1 diffraction order 808b) from grating patterns 602 oriented in any direction on the pattern mask 506. The darkfield stop 802 may thus include reflective and/or absorbing regions to block remaining diffraction orders such as, but not limited to zero-order diffraction 810 and second-order diffraction (e.g., +2 diffraction order 812a and −2 diffraction order 812b).

The projector illumination source 504 may provide any spatial profile of illumination. For example, as illustrated in FIG. 8B, the projector illumination source 504 may include a square-core fiber-based illumination source such that the diffracted orders 808a-812 may have square profiles. By way of another example, though not shown, the projector illumination source 504 may generate illumination with a circular distribution such that the diffracted orders 808a-812 may have circular profiles.

Further, the projection optics 508 may include one or more additional projection lenses 814 configured to relay the illumination passed by the darkfield stop 802 to the imaging detectors 302. For example, as illustrated in FIG. 8A, the additional projection lenses 814 may collimate the light passed by the darkfield stop 802. Accordingly, one or more additional lenses (e.g., the collection pathway lenses 136 and/or additional lenses within the detector assembly 122 (not shown)) may receive the collimated light and generate images of the patterns 602 on the imaging detectors 302.

The pattern mask 506 may be configured as a reflective or a transmissive mask. For example, as illustrated in FIGS. 5 through 8B, patterns 602 on a transmissive pattern mask 506 may be formed as transparent regions of the pattern mask 506 surrounded by opaque regions. In contrast, patterns 602 on a reflective pattern mask 506 (not shown) may be formed as reflective regions of the pattern mask 506 surrounded by transparent and/or absorbing regions.

It is to be understood that the pattern projector 502 illustrated in FIGS. 5 through 8B, along with the associated descriptions are provided solely for illustrative purposes and should not be interpreted as limiting. For example, the pattern mask 506 may have any distribution of pattern elements suitable for monitoring relative positions of the imaging detectors 302. By way of another example, the darkfield stop 802 may include any distribution of transmissive, reflecting, or absorbing portions to pass any selected diffraction orders.

As described previously herein, images of patterns 602 from a pattern mask 506 generated on multiple imaging detectors 302 may facilitate monitoring any lateral displacements between the imaging detectors 302. For example, a relative shift (e.g., due to vibrations, misalignment, or the like) of one imaging detector 302 may be observed as a shift of the locations of projected patterns on the shifted imaging detector 302.

In addition, images of patterns 602 from a pattern mask 506 generated on multiple imaging detectors 302 may facilitate monitoring of the telecentricity of an overlay target in the imaging system 104. For example, the positions of features of the overlay target may be measured with respect to the imaged patterns 602 on each imaging detector 302. Further, the imaging detectors 302 may be calibrated with respect to each other such that a feature observed at a given location on one imaging detector 302 (e.g., measured relative to the projected patterns 602) may be expected at known locations on the other imaging detectors 302 when the imaging system 104 is aligned within selected tolerances. In this regard, telecentricity error may be determined based on deviations of the positions of features of the overlay target from expected positions based on the calibration.

Referring again to FIG. 2, it is recognized herein that the quality of an image of an overlay target may not be uniform due to a variety of factors such as, but not limited to edge-diffraction effects associated with feature shape or aberrations of the imaging system 104. In another embodiment, alignment data (e.g., focus data, telecentricity data, centering data, or the like) is generated based on one or more selected portions of an overlay target (e.g., one or more selected features or selected portions of features). For example, images of overlay targets having periodic features may have a higher quality in the central regions 208 relative to the surrounding regions due to diffraction effects. Accordingly, alignment data may be generated based solely on selected regions of overlay targets such as, but not limited to, central regions 208 of overlay targets including periodic structures.

It is further recognized herein that the number and/or the distribution of the focal positions at which alignment images are captured may influence tradeoffs between accuracy of alignment corrections and throughput. For example, increasing the number of focal positions at which alignment images are measured may increase the accuracy of alignment data (e.g., focus data, telecentricity data, centering data or the like), but may decrease the throughput. Accordingly, the number of alignment images may be adjusted based on the needs and specifications of any given application.

In another embodiment, one or more components of the overlay metrology system 100 are adjustable to facilitate alignment adjustments (e.g., focus adjustments, telecentricity adjustments, or the like) for each selected overlay target on the sample 102. Further, the controller 106 may be communicatively coupled to the one or more adjustable components of the overlay metrology system 100. In this regard, the controller 106 may direct and/or control the adjustable components to align the sample within selected tolerances (e.g., focus tolerances, telecentricity tolerances, centering tolerances, or the like).

For example, focus errors may be controlled by adjusting (e.g., with the controller 106) the focal position of the sample 102 using any component or components of the imaging system 104. In one instance, the focal position of the sample 102 may be adjusted via the sample stage 108. In another instance, the focal position of the sample 102 may be controlled by adjusting a position of one or more elements of the collection pathway 120 such as, but not limited to, the objective lens 124 or the imaging detector 302.

By way of another example, telecentricity errors may be controlled by adjusting (e.g., with the controller 106) one or more components of the imaging system 104. In one instance, the telecentricity may be controlled by adjusting a position of the illumination aperture stop 130 to adjust the angle of illumination on the sample 102. In another instance, the telecentricity may be controlled by adjusting a position of the stop 140 to adjust the angle of radiation from the sample 102 used to generate an image. In another instance, the telecentricity may be controlled by adjusting a tilt of the sample 102 (e.g., using the sample stage 108).

By way of another example, centering errors may be controlled by adjusting (e.g., with the controller 106) the sample stage 108 to adjust the position of selected features of an overlay target to a selected position within the field of view of the imaging system 104 such as, but not limited to, a center of the field of view.

Figure 9:
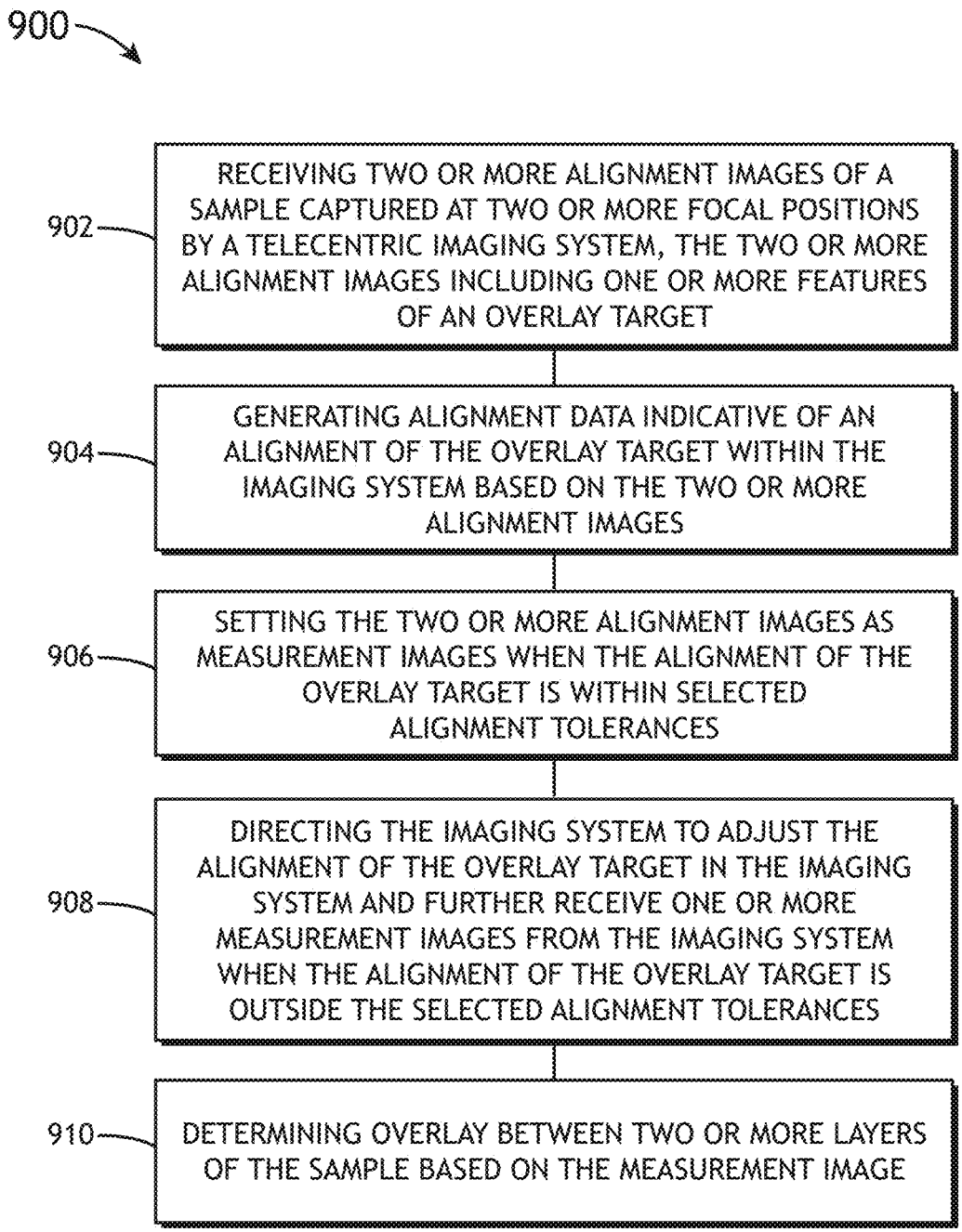
FIG. 9 is a flow diagram illustrating steps performed in a method for site-by-site overlay metrology, in accordance with one or more embodiments of the present disclosure.

FIG. 9 is a flow diagram illustrating steps performed in a method 900 for site-by-site overlay metrology, in accordance with one or more embodiments of the present disclosure. Applicant notes that the embodiments and enabling technologies described previously herein in the context of system 100 should be interpreted to extend to method 900. It is further noted, however, that the method 900 is not limited to the architecture of system 100.

It is recognized herein that site-by-site alignment of an overlay metrology tool for a selected number of overlay targets may correct for local variations of the sample to facilitate highly accurate overlay measurements.

In one embodiment, the method 900 includes a step 902 of receiving two or more alignment images of a sample captured at two or more focal positions by an imaging system (e.g., the imaging system 104), where the two or more alignment images include one or more features of an overlay target. The alignment images may be generated sequentially or simultaneously. For example, the alignment images may be generated sequentially using a single camera by adjusting the focal position of the sample and sequentially capturing alignment images. By way of anther example, the alignment images may be generated sequentially using multiple cameras configured to generate images at pre-selected focal positions.

In another embodiment, the method 900 includes a step 904 of generating alignment data of the sample in the imaging system based on the two or more alignment images. For example, alignment data may include focus data extracted from the alignment images indicative of the focal positions at which the alignment images were taken. The focus data may include, but is not required to include, image contrast data of the alignment images. Further, the image contrast data may be generated from the all pixels of the alignment images or within selected portions of the alignment images. For instance, the image contrast data may be, but is not required to be, extracted from portions of the alignment images including selected features of the metrology target. By way of another example, alignment data may include telecentricity data of the sample in the imaging system based on the two or more alignment images. The telecentricity data may include, but is not required to include, telecentricity errors manifested as lateral shifts of imaged features of the overlay target in the alignment images as a function of the focal position. By way of a further example, alignment data may include centering data associated with the alignment of the overlay target within the field of view of the imaging system. Accordingly, centering data may include positions of one or more features of the overlay target within the alignment images. For instance, it may be desirable to center the entire overlay target within the field of view of the imaging system. In another instance, it may be desirable to center a selected portion of the overlay target (e.g., a selected quadrant of the overlay target, a selected group of features on a selected layer, or the like) within the field of view of the imaging system.

Positions of imaged features of the overlay target as well as lateral shifts of the imaged features across a set of alignment images taken at different focal positions may be measured using any technique known in the art. In one embodiment, position data suitable for centering and/or telecentricity monitoring are determined based on reference patterns projected onto imaging cameras used to generate the alignment images. In this regard, the lateral positions of multiple imaging cameras may be cross-referenced and calibrated. Accordingly, the lateral shifts of imaged features of the overlay target in the alignment images may be measured based on the positions of the imaged features relative to the reference patterns for each respective camera. Further, the reference patterns may be used to calibrate the cameras such that deviations and/or misalignments of the cameras may be monitored and mitigated.

In another embodiment, the method 900 includes a step 906 of setting the two or more alignment images as measurement images when the alignment of the overlay target it within selected alignment tolerances (e.g., focus tolerances, telecentricity tolerances, centering tolerances, or the like). For example, it may be the case that an overlay target may be properly aligned within selected alignment tolerances when the alignment images are captured. Accordingly, the alignment images may serve as measurement images such that overlay between two or more sample layers may be extracted based on the alignment images.

In another embodiment, the method 900 includes a step 908 of directing the imaging system to adjust the alignment of the overlay target in the imaging system and further receiving one or more measurement images from the imaging system when the alignment of the overlay target is outside the selected alignment tolerances. For example, in the case where the alignment of the overlay target is outside the selected alignment tolerances, the overlay target may be realigned within the imaging system and additional images may be generated that are suitable for determining overlay.

For example, the step 908 may include directing (e.g., via the controller 106) the adjustment of one or more components of the imaging system to realign the overlay target within selected focus tolerances. In one instance, focus data such as, but not limited to, image contrast of each alignment image may be mapped to a calibrated set of focus data to determine a current focal position of the sample. Accordingly, the focal position of the sample may be adjusted such that the overlay target is in focus on a detector of the imaging system. Further, the focal position may be adjusted by any means known in the art such as, but not limited to, adjusting a position of a sample stage securing the sample, adjusting a position of an objective lens of the imaging system, or adjusting a position of a detector of the imaging system.

By way of another example, the step 908 may include directing (e.g., via the controller 106) the adjustment of one or more components of the imaging system to realign the overlay target within selected telecentricity tolerances. In one instance, the telecentricity may be controlled by adjusting an aperture stop in either an illumination arm or an imaging arm of the overlay metrology tool. In another instance, the telecentricity may be controlled by adjusting the tilt of the sample.

By way of another example, the step 908 may include directing (e.g., via the controller 106) the adjustment of one or more components of the imaging system to position a portion of the overlay target at a selected location within a field of view of the imaging system. For instance, a portion of the overlay target may be, but is not required to be, centered within the field of view of the imaging system.

Once the overlay target is aligned within the selected alignment tolerances, the step 908 may include receiving one or more additional images (e.g., measurement images) from the imaging system suitable for determining overlay of two or more layers of the sample.

In another embodiment, the method 900 includes a step 910 of determining overlay between two or more layers of the sample based on at least one measurement image (e.g., a measurement image associated with an alignment image or an additional image captured after realignment).

Overlay between two or more sample layers may be determined using any number of measurement images. For example, overlay may be determined using a single measurement image using any overlay method known in the art (e.g., an image-based overlay method in which overlay is determined based on relative positions of imaged features in two or more layers, or a scatterometry-based method in which overlay is determined based on a model-based analysis of diffracted light from overlapping grating structures on two more layers). By way of another example, overlay may be determined using two or more measurement images at different focal positions. For instance, overlay may be determined based on a first image, and variations between additional measurement images at different focal positions may be used to provide corrections to the overlay measurement to increase the measurement accuracy. As an example, telecentricity errors are first determined based on relative positional shifts of imaged features across two more measurement images captured at different focal positions. Further, the telecentricity errors, once known, may be used to generate corrections to the overlay measurement. In this regard, it may be the case that some alignment inaccuracies within certain tolerances may be corrected using postprocessing using multiple measurement images such that additional realignment and measurement procedures (e.g., step 908) are not necessary.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system comprising:
a controller communicatively coupled to a telecentric imaging system including one or more cameras configured to capture images through an objective lens at two or more focal positions, the controller including one or more processors configured to execute program instructions causing the one or more processors to:
receive two or more alignment images of an overlay target on a sample captured at two or more focal positions by the imaging system, the two or more alignment images including one or more features of the overlay target;
generate alignment data indicative of an alignment of the overlay target within the imaging system based on the two or more alignment images;
set the two or more alignment images as measurement images when the alignment of the overlay target is within selected alignment tolerances;
direct the imaging system to adjust the alignment of the overlay target in the imaging system and further receive one or more measurement images from the imaging system when the alignment of the overlay target is outside the selected alignment tolerances; and
determine overlay between two or more layers of the sample based on at least one of the measurement images.

2. The overlay metrology system of claim 1, wherein the imaging system comprises:
two or more cameras configured to image the two or more focal positions, wherein the two or more cameras simultaneously generate the two or more alignment images.

3. The overlay metrology system of claim 1, wherein the imaging system comprises:
a single camera configured to sequentially generate the two or more alignment images as the focal position of the overlay target is varied.

4. The overlay metrology system of claim 3, wherein the focal position of the overlay target is varied by translating a sample stage securing the sample.

5. The overlay metrology system of claim 3, wherein the focal position of the overlay target is varied by translating an objective lens of the imaging system.

6. The overlay metrology system of claim 3, wherein the focal position of the overlay target is varied by translating a detector of the imaging system.

7. The overlay metrology system of claim 1, wherein determining the overlay between two or more layers of the sample based on at least one of the measurement images comprises:
determining the overlay between two or more layers of the sample based on one of the measurement images.

8. The overlay metrology system of claim 1, wherein determining the overlay between two or more layers of the sample based on at least one of the measurement images comprises:
determining the overlay between two or more layers of the sample based on at least two of the measurement images.

9. The overlay metrology system of claim 1, wherein the alignment data comprises:
focus data indicative of a quality of focus of the overlay target in the two or more alignment images, wherein the selected alignment tolerances include selected focus tolerances.

10. The overlay metrology system of claim 9, wherein the focus data comprises:
image contrast data of the two or more alignment images.

11. The overlay metrology system of claim 10, wherein the image contrast data comprises:
differences in pixel values between at least some of the one or more features of the overlay target and background areas.

12. The overlay metrology system of claim 10, wherein generating image contrast data for each of the two or more alignment images comprises:
performing a spatial frequency analysis of at least some of the one or more features of the overlay target, wherein the image contrast data is based on relative strengths of selected spatial frequencies.

13. The overlay metrology system of claim 10, wherein generating alignment data comprises:
generating image contrast data for each of the two or more alignment images; and
determining the focus data of the sample by comparing the image contrast data of the two or more alignment images to calibrated image contrast data.

14. The overlay metrology system of claim 13, wherein the calibrated image contrast data comprises:
image contrast data from images of test features at a plurality of focal positions.

15. The overlay metrology system of claim 14, wherein the calibrated image contrast data is generated by the controller upon receipt of the images of the test features at the plurality of focal positions.

16. The overlay metrology system of claim 13, wherein the calibrated image contrast data is received by the controller prior to determining the focus data of the sample.

17. The overlay metrology system of claim 1, wherein the alignment data comprises:
    telecentricity data indicative of a quality of telecentricity of the overlay target in the imaging system, wherein the selected alignment tolerances include selected telecentricity tolerances.

18. The overlay metrology system of claim 17, wherein determining the telecentricity data comprises:
    determining the telecentricity data based on positional variations of the one or more features in the two or more alignment images.

19. The overlay metrology system of claim 18, wherein determining the telecentricity data based on positional variations of the one or more features in the two or more alignment images comprises:
    determining positions of the one or more features in each of the two or more alignment images; and
    measuring a telecentricity error as a rate of positional change of the one or more features as a function of focal position based on the two or more alignment images.

20. The overlay metrology system of claim 1, further comprising:
    a pattern projector configured to project one or patterns onto one or more cameras of the imaging system, wherein the one or more patterns provide reference data for determining positional variations of the one or more features.

21. The overlay metrology system of claim 20, wherein determining the telecentricity data comprises:
    determining positions of the one or more features in each of the two or more alignment images relative to the one or more patterns; and
    measuring a telecentricity error as a rate of positional change of the one or more features as a function of focal position based on the two or more alignment images.

22. The overlay metrology system of claim 20, wherein the one or more patterns comprise:
    at least one pattern along a first direction; and
    at least one pattern along a second direction orthogonal to the first direction.

23. The overlay metrology system of claim 20, wherein the one or more patterns comprise:
    one or more grating patterns including a periodic distribution of pattern elements.

24. The overlay metrology system of claim 20, wherein the pattern projector comprises:
    a pattern mask including the one or more patterns;
    an illumination source configured to illuminate the pattern mask; and
    a pattern imaging system configured to generate an image of the pattern mask on the one or more cameras.

25. The overlay metrology system of claim 24, wherein the one or more patterns comprise:
    at least one grating pattern including pattern elements periodically distributed along a first direction; and
    at least one grating pattern including pattern elements periodically distributed along a second direction orthogonal to the first direction.

26. The overlay metrology system of claim 25, wherein the pattern projector further comprises:
    a darkfield stop located at a pupil plane of the pattern imaging system to receive illumination from the illumination source diffracted by the one or more patterns, wherein an aperture of the darkfield stop passes two selected diffraction orders along the first direction and two selected diffraction orders along the second direction.

27. The overlay metrology system of claim 26, wherein the two selected diffraction orders along the first direction include a +1 diffraction order and a −1 diffraction order, wherein the two selected diffraction orders along the second direction include a +1 diffraction order and a −1 diffraction order.

28. The overlay metrology system of claim 26, wherein the darkfield stop includes an annular aperture.

29. The overlay metrology system of claim 1, wherein directing the imaging system to adjust the alignment of the overlay target in the imaging system comprises:
    adjusting one or more components of the imaging system to control a focal position of the sample to align the imaging system within the selected focus tolerances.

30. The overlay metrology system of claim 29, wherein adjusting one or more components of the imaging system to control a focal position of the sample to align the imaging system within the selected focus tolerances comprises:
    adjusting a position of a sample stage securing the sample.

31. The overlay metrology system of claim 29, wherein adjusting one or more components of the imaging system to control a focal position of the sample to align the imaging system within the selected focus tolerances comprises:
    adjusting a position of an objective lens.

32. The overlay metrology system of claim 29, wherein adjusting one or more components of the imaging system to control a focal position of the sample to align the imaging system within the selected focus tolerances comprises:
    adjusting a position of a detector.

33. The overlay metrology system of claim 1, wherein the alignment data comprises:
    focus data indicative of a quality of focus of the overlay target in the two or more alignment images, wherein the selected alignment tolerances include selected focus tolerances; and
    telecentricity data indicative of a quality of telecentricity of the overlay target in the imaging system, wherein the selected alignment tolerances include selected telecentricity tolerances.

34. The overlay metrology system of claim 33, wherein directing the imaging system to adjust the alignment of the overlay target in the imaging system comprises:
    adjusting one or more components of the imaging system to align the imaging system within the selected telecentricity tolerances.

35. The overlay metrology system of claim 34, wherein controlling one or more components of the imaging system to align the imaging system within the selected telecentricity tolerances comprises:
    adjusting a position of an aperture stop.

36. The overlay metrology system of claim 34, wherein controlling one or more components of the imaging system to align the imaging system within the selected telecentricity tolerances comprises:
    controlling a tilt of the sample using a sample stage.

37. The overlay metrology system of claim 35, wherein the aperture stop is within an optical path of the illumination sub-system.

38. The overlay metrology system of claim 35, wherein the aperture stop is within an optical path of the imaging system.

39. The overlay metrology system of claim 1, wherein directing the imaging system to adjust the alignment of the overlay target in the imaging system comprises:
  centering at least one selected feature of the overlay target within a field of view of the imaging system.

40. The overlay metrology system of claim 1, wherein the one or more features of the overlay target comprise:
  a portion of the overlay target.

41. The overlay metrology system of claim 1, wherein the one or more features of the overlay target are located on a selected layer of the overlay target.

42. The overlay metrology system of claim 41, wherein the selected layer of the overlay target comprises:
  a resist layer.

43. An overlay metrology system comprising:
  a telecentric imaging system including one or more cameras configured to capture images through an objective lens at two or more focal positions; and
  a controller communicatively coupled to the imaging system, the controller including one or more processors configured to execute program instructions causing the one or more processors to:
    receive two or more alignment images of an overlay target on a sample captured at two or more focal positions by the imaging system, the two or more alignment images including one or more features of the overlay target;
    generate alignment data indicative of an alignment of the overlay target within the imaging system based on the two or more alignment images;
    set the two or more alignment images as measurement images when the alignment of the overlay target is within selected alignment tolerances;
    direct the imaging system to adjust the alignment of the overlay target in the imaging system and further receive one or more measurement images from the imaging system when the alignment of the overlay target is outside the selected alignment tolerances; and
    determine overlay between two or more layers of the sample based on at least one of the measurement images.

44. An overlay metrology method comprising:
  receiving two or more alignment images of a sample captured at two or more focal positions by a telecentric imaging system, the two or more alignment images including one or more features of an overlay target;
  generating, with one or more processors, alignment data indicative of an alignment of the overlay target within the imaging system based on the two or more alignment images;
  setting the two or more alignment images as measurement images when the alignment of the overlay target is within selected alignment tolerances;
  directing the imaging system to adjust the alignment of the overlay target in the imaging system and further receive one or more measurement images from the imaging system when the alignment of the overlay target is outside the selected alignment tolerances; and
  determining, with one or more processors, overlay between two or more layers of the sample based on the measurement image.

\* \* \* \* \*